(12) United States Patent
Luch

(10) Patent No.: US 7,120,005 B1
(45) Date of Patent: Oct. 10, 2006

(54) ELECTROMAGNETIC INTERFERENCE SHIELDS AND METHODS OF MANUFACTURE

(76) Inventor: Daniel Luch, 17161 Copper Hill Dr., Morgan Hill, CA (US) 95037

( * ) Notice: Subject to any disclaimer, the term of this patent is extended or adjusted under 35 U.S.C. 154(b) by 447 days.

(21) Appl. No.: 10/756,072

(22) Filed: Jan. 12, 2004

Related U.S. Application Data

(63) Continuation-in-part of application No. 09/778,636, filed on Feb. 6, 2001, now Pat. No. 6,697,248.

(51) Int. Cl.
*H02H 47/00* (2006.01)
(52) U.S. Cl. .................................................... 361/220
(58) Field of Classification Search ................ 361/220
See application file for complete search history.

(56) References Cited

U.S. PATENT DOCUMENTS

| | | | | |
|---|---|---|---|---|
| 3,481,840 A | * | 12/1969 | Hertz et al. ................. 428/601 |
| 4,158,612 A | * | 6/1979 | Luch et al. .................... 205/67 |
| 5,186,813 A | * | 2/1993 | Helms ......................... 205/171 |
| 5,281,327 A | * | 1/1994 | Honda et al. ................ 205/198 |
| 6,120,669 A | * | 9/2000 | Bradley ....................... 205/114 |
| 6,459,032 B1 | * | 10/2002 | Luch ........................... 136/244 |
| 6,582,887 B1 | * | 6/2003 | Luch ........................... 430/311 |
| 6,697,248 B1 | * | 2/2004 | Luch ........................... 361/220 |

* cited by examiner

*Primary Examiner*—Stephen W. Jackson

(57) ABSTRACT

The invention teaches improved materials and processes for production of structures to shield against ingress or egress of electromagnetic radiation. The structures and processes taught are based on the recognition and use of directly electroplateable resins. The directly electroplateable resins are combined with electrodeposited metal-based coatings to result in uniquely suitable structures to achieve radiation shielding. Fabrication and compositional flexibility of directly electroplateable resins and low cost material possibilities contribute to the unique suitability of directly electroplateable resins in the production of improved electromagnetic radiation shields.

3 Claims, 11 Drawing Sheets

ELECTROMAGNETIC INTERFERENCE SHIELDS AND METHODS OF MANUFACTURE

CROSS-REFERENCE TO RELATED APPLICATIONS

This application is a Continuation-in-Part of U.S. patent application Ser. No. 09/778,636 filed Feb. 6, 2001 now U.S. Pat. No. 6,697,248, entitled Electromagnetic Interference Shields and Methods of Manufacture. The entire contents of the above identified application are incorporated herein by this reference.

BACKGROUND OF THE INVENTION

The proliferation of electronic devices over the past several years has created problems of radiation containment from these devices. When a digital device changes voltage, it emits electrical and magnetic energy that is comparable to frictional heat loss in any mechanical machine. When not controlled, this radiation can interfere with the normal operating use of other electrical devices. In addition, many devices need to be shielded against incoming radiation to prevent damage to the product itself. As is known in the art, the prevention of egress or ingress of electromagnetic radiation is referred to as electromagnetic interference (EMI) shielding.

The typical methods to shield electronic devices consist of surrounding the electronic components with a conductive barrier which reflects and/or absorbs the radiation. However, the problems associated with electromagnetic interference continue to challenge manufacturers due to the proliferation of devices, increasing clock speeds, and the increased density of electronic packaging resulting from continual size reductions in portable devices. The problems have been further compounded by the increased use of plastic housings. Plastics tend to cost and weigh less than alternative metal structures, are resistant to corrosion and provide much greater design flexibility. However, plastics are natural insulators and as such are generally transparent to electromagnetic radiation in the applicable frequency range. Electronic equipment manufacturers have therefore been forced to find ways to shield the plastic enclosures to protect the components inside and comply with applicable regulations.

When evaluated according to standard testing protocol, the shielding imparted by a particular structure is reported in decibels. The shielding effect is measured by the following equation:

Shielding effect (dB)=20 log ($E_1/E_2$)

Where:
$E_1$ is the receiving level when no shielding material is placed between the transmitting and receiving antennas, and
$E_2$ is the receiving level when a shielding material is placed between transmitting and receiving antennas.

20 dB is generally considered a minimum range for meaningful shielding. 30–60 dB can be sufficient to solve moderate problems. 60–90 dB represents excellent shielding solving moderate to severe problems.

Many different electromagnetic shielding methods exist. The simplest in concept is to select a metal housing or cabinet for the shield. The use of metal shields includes stamped shells or cabinets, zinc die castings, and sheet metal liners. Stamped shells can be a cost effective way to shield sensitive components inside a device. However, such shells do not necessarily protect the rest of the device from external sources of radiation and design flexibility is limited. Zinc die castings provide effective shielding, especially in high temperature environments. However, zinc die castings are costly, heavy, and design flexibility is limited. Sheet metal liners can be combined with the appeal of a plastic exterior, but sheet metal liners tend to be expensive and have to be attached to the plastic housing which complicates and lengthens the assembly process.

A number of methods have been developed to provide shielding to plastic components. Perhaps the simplest is to make the bulk plastic itself sufficiently conductive to impart required shielding performance. This technology generally involves mixing of the conductive filler into the polymer resin prior to fabrication of the material into its final shape. The conductive fillers typically consist of very high aspect ratio particles such as metal fibers to minimize the adverse processing and physical property affects and high cost associated with required loadings when using fillers of lower aspect ratios (for example metal powders).

The most effective and widely employed fibers are stainless steel fibers and nickel coated graphite fibers. Properly molded conductive fiber loaded plastics offer good shielding performance but suffer from a number of major downfalls. The first is the need to maintain integrity and even distribution of the conductive fibers in the plastic matrix during compounding and fabrication. High shear processing can result in the breakage of the fibers and reduction in the material conductivity. It also may be difficult to maintain uniformity of fiber concentration in a final molded part. A further problem is the need to maintain good surface conductivity. Conductive fiber filled plastics can exhibit poor surface conductivity even though bulk conductivity is acceptable. This "skin" effect can result in slot antennas at mating surfaces and prevent additional processing, if desired or necessary, requiring such surface conductivity. The fiber loadings required can negatively impact the aesthetic quality of the surface finish. Finally, the cost of the fibrous filler is very high, often negating the savings achieved through the elimination of secondary processing.

Efforts have been made to overcome the reduced surface conductivity often associated with conductive fiber filled plastics. For example, U.S. Pat. No. 4,596,670 to Liu teaches compositions containing polymer binder, metal flake, conductive fibrous fillers and conductive carbon black. However, these heavily loaded compositions can be difficult to process and other material properties are negatively impacted. Further, these compositions do not eliminate the other problems associated with using fibers mentioned above.

Another widely used material form in the art of electromagnetic (EMI) shielding consists of electrically conductive meshes or webs. These structures generally comprise conductive fibers, normally metal containing, fabricated into a mesh or screen by knitting, braiding or non-woven fabric technology. Alternatively, metal foils with a myriad of punched holes can be considered.

Metal containing fiber mesh structures have been used for many years to provide EMI shielding for openings in enclosures to allow an air flow for cooling and ventilation.

Another direction of development to provide EMI shielding to plastic components is incorporation of the conductive fabrics, webs, or meshes into a final composite article. The general concept is to confine the expensive conductive filler to an essentially sheetlike structure and thereby eliminate the need to have conductivity throughout the bulk volume of the article. Thus, introduction of such a conductive web during fabrication of the article conceptually eliminates secondary operations while eliminating the difficulties and expense associated with imparting bulk conductivity throughout the entire volume of the article. One form of this technology involves production of a metal mesh or web by weaving or hole punching a thin foil. This technique is taught in U.S. Pat. No. 5,473,111 to Hattori et al. and U.S. Pat. No. 6,054,647 to Ridener. Hattori taught a shield member of planar plate-shaped wire netting made of copper wires (or the like) 30 to 60 micrometers in diameter or a copper foil having a plurality of small holes. A precut shield member was placed inside a mold cavity such that a portion of the member extends from the outer peripheries of the cavity upon closure of the mold. Unfortunately, injection of plastic resin into a mold cavity typically involves high pressures and shear which can cause destruction to fragile netting or foils. Hattori proposed to solve this by injecting a portion of the resin prior to mold closing and carefully monitoring the rate of mold closure to achieve a partial "compression molding" process. Clearly, this would be impractical except for the very simplest of geometries.

Ridener taught weaving a grid from nickel coated steel fibers and then annealing and calendering to bond the fibers together at the cross-over points of the grid. The bonding was taught to provide increased integrity and conductivity to the grid, allowing it to be used as an insert in an injection molding operation. Unfortunately, the combined operations of nickel plating, drawing, weaving, annealing and sintering involved in the grids taught considerably adds to manufacturing cost. In addition, the insert molding involves preforming of the insert and considerable restriction of the design aspects of the part.

Another form of the conductive web technology envisions formation of a non-woven fabric by combining electrically conductive fibers bound together with resinous fibers. For example, U.S. Pat. No. 4,939,027 to Daimon et al. teaches manufacture of an electroconductive thermoplastic resin sheet comprising a non-woven fabric composed mainly of electroconductive fibers and heat-meltable fibers laminated between first and second thermoplastic films. Stainless steel fibers were taught as one example of the conductive fibers used to produce the non-woven fabric. The Daimon patent reports EMI shielding as high as 60 dB (at 300 MHz) for the conductive sheets taught. U.S. Pat. No. 4,943,477 to Kanamura et al. taught production of a conductive sheet by combining chemically metal plated fibers with heat fusible fibers to form a non-woven fabric which was subsequently hot-press molded to effect a monolithic fused sheet. Kanamura reported electric shielding effectiveness as high as 70 dB (at 1000 MHz) for the sheets taught in the patent.

The conductive fibers taught by Daimon and Kanamura are expensive and the processing to produce the precursor conductive non-woven sheets is complicated. In addition, the reasonably high shielding values reported by Daimon and Kanamura were obtained on essentially flat sheets of the composites taught. However, a significant problem arises when one attempts to form more useful three dimensional articles from such sheets, either through stamping or thermoforming. The resin flow and expansion involved in these operations tends to separate and fracture the fibers, resulting in loss of fiber to fiber contact and conductivity necessary to achieve shielding. Thus, the shielding of the Daimon and Kanamura composites would be expected to be drastically reduced should those composites be formed into three dimensional articles. This problem was addressed by U.S. Pat. Nos. 5,028,490, 5,124,198, and 5,226,210 to Koskenmaki et al. and U.S. Pat. Nos. 5,869,412, 6,013,376 and 6,090,728 to Yenni, Jr. et al. One of the major goals of this group of patents is production of metal/polymer composite sheets which are thermoformable without significant deterioration of shielding quality. The metal is present in the form of fine, randomly oriented metal fibers forming a mat supported by a polymeric substrate or carrier sheet. The metal fibers are made of metals and alloys having melting points less than the temperatures required to soften the polymeric components sufficiently to carry out the thermoforming operation. In this case, fibers are molten and rupture is minimized during the dimensional expansion of the sheet during the thermoforming operation. The patents reported shielding effectiveness of a thermoformed article (metal fiber loading of 242 grams per square meter) ranging from 48–58 dB over the range 30–1000 MHz. A problem is that the low melting point metal fibers employed are relatively expensive and manufacture of the precursor sheets is complicated, thereby significantly increasing the cost of the final shaped article. In addition, significant amounts of trim waste of the expensive sheets can be associated with the thermoforming operation, further increasing cost.

Further general problems with the use of conductive mats or sheets as shields exist in that they normally end up embedded in the final article, resulting in a non-conductive surface. This can result in loss of electrical communication along the edges of mating parts and production of a "slot antenna". Further, special operations are required if electrical communication must be achieved to other components of the device (for example the ground plane of a circuit board). Special connectors can be used, but at added cost. The Hattori U.S. Pat. No. 5,473,111 discussed above proposed to address this problem by extending the shield member outside the periphery of the resin portion of the part, but this is clearly impractical in most cases. Yenni et al. U.S. Pat. No. 6,090,728 taught exterior electrical connection by confining the insulating resinous layer covering the metal fiber mat to a thickness less than 0.15 mm. Using a specially designed and precisely controlled heat staking die, electrical connection to exterior conductive components was achieved. The unique design of the part and die along with the precise heat control required limits the application of this technique. In addition, the heat staking technique does not address the additional "slot antenna" problem.

There is thus a need to improve the "conductive mat" technology to avoid the use of very expensive metal fibers currently employed and simplify the elaborate processing currently necessary for production of the precursor materials.

Further teachings regarding EMI shielding comprising conductive webs or meshes involves the design and manufacture of high performance shielding gaskets. The outer covers of electronic equipment are usually formed by combining more than one housing component. To provide the entire cover with EMI shielding properties, electrical continuity must be achieved among the multiple components. In addition, should the mating surfaces of housing components not contact adequately, a gap is formed in the joint between housing components. Leakage of electromagnetic radiation can occur through this gap.

Electrical continuity among multiple housing components can be achieved in a number of ways. As pointed out in U.S. Pat. No. 5,170,009 to Kadokura, methods such as lead wires, application of silver paste, spray coating of conductive paints and use of damping screws have been employed. All of these techniques have characteristic disadvantages. Kadokura in U.S. Pat. No. 5,170,009 taught simultaneously electrodepositing a conductive coating comprising fine conductive particles and an electroplateable resin base. The coating was sufficiently conductive and conformable to act as a "conductive gasket" between mating surfaces. The many steps, expensive materials and the fact that the entire component has to be coated with the specialized electrodeposited coating severely limit applications of the technique.

Shielding gaskets are known which comprise resilient materials such as elastomers filled with a conductive filler. For example, U.S. Pat. No. 4,662,967 to Bogan et al. describes a shielding gasket comprising conductive filler mixed with an elastomer and bonding agent. The gasket is bonded to a surface by curing the gasket material in contact with the surface.

As electronic equipment has evolved, higher frequencies are encountered, and the electrical conductivity imparted by conductive fillers becomes only marginally effective for adequate attenuation of the high frequency spectrum of the radiation. Thus, where such higher frequencies are encountered, it becomes necessary to utilize conductive mesh materials supported on a resilient core material such as an elastomer or foam to provide adequate shielding levels. Shielding structures comprising metal mesh supported by an internal resilient core are taught in U.S. Pat. RE33,256, U.S. Pat. Nos. 5,028,739, 5,386,345, and 5,142,101. A common feature of these higher performance gaskets is the requirement of providing some form of metal fiber mesh. These meshes utilize fibers made of relatively expensive materials such as stainless steel, Monel, tin-coated copper, or metal plated polymeric fibers. In addition, processing of the individual fibers into the mesh adds considerably to the overall cost of the gasket.

It is clear that the shielding techniques using metal-containing meshes, whether aimed at shielding ventilation openings, incorporation into final plastic components or for use in gasketing, could be greatly advanced by improved processing techniques for production of the mesh structures and the use of a minimum of expensive materials.

Another method for imparting EMI shielding capability to plastic articles is the use of conductive paints. These paints usually comprise copper or nickel powder or flake in a polymeric binder. Conductive paints can be applied with simple, conventional spray painting equipment. For parts with simple designs, painting is a low cost shielding option due to low capital costs. The paints can usually be applied to most plastics although some require an adhesion promoting treatment. One major disadvantage of conductive painting is that it is a line of sight process making it difficult to successfully shield recessed or ribbed areas. Thin coatings also will not provide good shielding effectiveness so multiple coats may be required. This may be a particular problem at sharp corners where the well-known "pull-away" characteristic of paints may lead to slot antenna effects. Finally, the multiple coats which may be required result in significant material overspray waste, environmental difficulties, and increased costs. It is also difficult to achieve consistent paint thickness over the surface of an article which can result in variations in shielding performance. Finally, conductive paints often suffer from problems with durability over time. Due to these drawbacks the use of conductive paint coatings has grown very slowly over the past several years.

Yet another method for imparting EMI shielding capability to plastic articles is vacuum metallizing. In the vacuum metallizing process, parts are masked if necessary and then placed on rotating fixtures inside a vacuum chamber. Inside the chamber a metal, usually aluminum, is heated and vaporized. The metal will then condense on the surface of the plastic. Vacuum metallizing is generally a batch process that is best suited for small to moderate sized parts with limited geometrical complexity. For example, U.S. Pat. No. 5,811,050 to Gabower teaches the use of vacuum metallizing to shield thermoformed plastic parts. Thermoforming is a process limited to parts of relatively simple geometry. Gabower reported shielding effectiveness values of up to 60 dB for vacuum metallized, thermoformed parts. Thus, for these types of parts, vacuum metallizing provides reasonable shielding effectiveness at a relatively moderate cost. A major disadvantage of vacuum metallizing is the need for special equipment which requires a significant capital investment as well as a high operator skill level. In addition, vacuum deposition of the relatively thick films required for EMI shielding can be complex and process sensitive, as discussed in the Gabower U.S. Pat. No. 5,811,050. Like spray painting, vacuum metallizing is generally a line of sight process which makes it difficult to successfully shield recessed or ribbed areas. Finally, a base coat or ionization treatment is often required between the plastic and aluminum to minimize surface defects, and a protective coating may be required to protect the vacuum deposited metal.

An alternative method for imparting EMI shielding to plastics is electroless plating. Electroless plating involves chemically coating a nonconductive surface such as a plastic with a continuous metallic film. Unlike conventional electroplating, electroless plating does not require the use of electricity to deposit the metal. Instead, a series of chemical steps involving etchants and catalysts prepare the nonconductive plastic substrate to accept a metal layer deposited by chemical reduction of metal from solution. The process usually involves depositing a thin layer of highly conductive copper followed by a nickel topcoat which protects the copper sublayer from oxidation and corrosion. The thickness of the nickel topcoat can be adjusted depending on the abrasion and corrosion requirements of the final product. Because electroless plating is an immersion process, uniform coatings can be applied to almost any configuration regardless of size or complexity without a high reliance on operator skill. Electroless plating also provides a highly conductive pure metal surface which results in relatively good shielding effectiveness. In addition, electrolessly plated parts can be subsequently electroplated, although electroplating is generally not used unless a part also has certain decorative or functional requirements. On average, the cost of electroless plating will be higher than vacuum metallizing and conductive paints. The many steps employing harsh and expensive chemicals make the process intrinsically costly and environmentally difficult. The process comprises many steps and is very sensitive to processing variables used to fabricate the plastic substrate, limiting applications to carefully molded parts and designs. It may be difficult to properly mold conventional plateable plastics using the rapid injection rates often required for the thin walls of electronic components. The rapid injection rates can cause poor surface distribution of etchable species, resulting in poor surface roughening and subsequent inferior bonding of the chemically deposited metal. The rates at which metals can be chemically deposited are relatively slow, leading to increased process times to deposit the thicknesses required for adequate shielding and abrasion resistance. Finally, selective metallizing can be difficult, especially on complex parts, since the electroless plating may tend to coat any exposed surface unless the overall process is carefully controlled. The conventional technology for metal plating on plastic (etching, chemical reduction, optional electroplating) has been extensively documented and discussed in the public and commercial literature. See, for example, Saubestre, Transactions of the Institute of Metal Finishing, 1969, Vol. 47, or Arcilesi et al., Products Finishing, March 1984.

Many attempts have been made to simplify the process of plating on plastic substrates. Some involve special chemical techniques to produce an electrically conductive film on the surface followed by electroplating. Typical examples of the approach are taught by U.S. Pat. No. 3,523,875 to Minklei, U.S. Pat. No. 3,682,786 to Brown et. Al., and U.S. Pat. No. 3,619,382 to Lupinski. The electrically conductive surface film produced was then electroplated.

Another approach proposed to simplify electroplating of plastic substrates is incorporation of electrically conductive fillers into the resin to produce an electrically conductive plastic that is then electroplated. When considering producing an electrically conductive polymer intended to be electroplated, one should consider "microscopic" resistivity in order to achieve uniform, "hole-free" deposit coverage. Thus, the fillers chosen will likely comprise those that are relatively small, but with loadings sufficient to supply the required conductive contacting. Such fillers include metal powders and flake, metal coated mica or spheres, conductive carbon black and the like.

Efforts to advance systems contemplating metal electrodeposition directly onto the surface of an electrically conductive polymer have encountered a number of obstacles. The first is the combination of fabrication difficulty and material property deterioration brought about by the heavy filler loadings often required. A second is the high cost of many conductive fillers employed such as silver flake.

Another major obstacle involved in the electroplating of electrically conductive polymers is a consideration of adhesion between the electrodeposited metal and polymeric substrate (metal/polymer adhesion). In some cases such as electroforming, where the electrodeposited metal is eventually removed from the substrate, metal/polymer adhesion may actually be detrimental. However, in most cases sufficient adhesion is required to prevent metal/polymer separation during extended environmental and use cycles.

A number of methods to enhance adhesion have been employed. For example, etching of the surface prior to plating can be considered. Etching can be achieved by immersion in vigorous solutions such as chromic/sulfuric acid. Alternatively, or in addition, an etchable species can be incorporated into the conductive polymeric compound. The etchable species at exposed surfaces is removed by immersion in an etchant prior to electroplating. Oxidizing surface treatments can also be considered to improve metal/plastic adhesion. These include processes such as flame or plasma treatments or immersion in oxidizing acids.

In the case of conductive polymers containing finely divided metal, one can propose achieving direct metal-to-metal adhesion between electrodeposit and filler. However, here the metal particles are generally encapsulated by the resin binder, often resulting in a resin rich "skin". To overcome this effect, one could propose methods to remove the "skin", exposing active metal filler to bond to subsequently electrodeposited metal.

Another approach to impart adhesion between conductive resin substrates and electrodeposits is incorporation of an "adhesion promoter" at the surface of the electrically conductive resin substrate. This approach was taught by Chien et al. in U.S. Pat. No. 4,278,510 where maleic anhydride modified propylene polymers were taught as an adhesion promoter. Luch, in U.S. Pat. No. 3,865,699 taught that certain sulfur bearing chemicals could function to improve adhesion of initially electrodeposited Group VIII metals.

An additional major obstacle confronting development of electrically conductive polymeric resin compositions capable of being directly electroplated is the initial "bridge" of electrodeposit on the surface of the electrically conductive resin. In electrodeposition, the substrate to be plated is often made cathodic through a pressure contact to a metal rack tip, itself under cathodic potential. However, if the contact resistance is excessive or the substrate is insufficiently conductive, the electrodeposit current favors the rack tip to the point where the electrodeposit will not bridge to the substrate.

Moreover, a further problem is encountered even if specialized racking successfully achieves electrodeposit bridging to the substrate. Many of the electrically conductive polymeric resins have resistivities far higher than those of typical metal substrates. The polymeric substrate can be relatively limited in the amount of electrodeposition current which it alone can convey. Thus, the conductive polymeric substrate does not cover almost instantly with electrodeposit as is typical with metallic substrates. Except for the most heavily loaded and highly conductive polymer substrates, a large portion of the electrodeposition current must pass back through the previously electrodeposited metal growing laterally over the surface of the conductive plastic substrate. In a fashion similar to the bridging problem discussed above, the electrodeposition current favors the electrodeposited metal and the lateral growth can be extremely slow and erratic. This restricts the size and "growth length" of the substrate conductive pattern, increases plating costs, and can also result in large non-uniformities in electrodeposit integrity and thickness over the pattern.

This lateral growth is dependent on the ability of the substrate to convey current. Thus, the thickness and resistivity of the conductive polymeric substrate can be defining factors in the ability to achieve satisfactory electrodeposit coverage rates.

This coverage rate problem likely can be characterized by a continuum, being dependent on many factors such as the nature of the initially electrodeposited metal, electroplating bath chemistry, the nature of the polymeric binder and the resistivity of the electrically conductive polymeric substrate. As a "rule of thumb", the instant inventor estimates that coverage rate problems would demand attention if the resistivity of the conductive polymeric substrate rose above about 0.001 ohm-cm.

Beset with the problems of achieving adhesion and satisfactory electrodeposit coverage rates, investigators have attempted to produce directly electroplateable polymers by heavily loading polymers with relatively small metal containing fillers. Such heavy loadings are sufficient to reduce both microscopic and macroscopic resistivity to a level where the coverage rate phenomenon may be manageable. However, attempts to make an acceptable directly electroplateable resin using the relatively small metal containing fillers alone encounter a number of barriers. First, the fine metal containing fillers are relatively expensive. The loadings required to achieve the particle-to-particle proximity to achieve acceptable conductivity increases the cost of the polymer/filler blend dramatically. The metal containing fillers are accompanied by further problems. They tend to cause deterioration of the mechanical properties and processing characteristics of many resins. This significantly limits options in resin and fabrication selection. All polymer processing is best achieved by formulating resins with processing characteristics specifically tailored to the specific process (injection molding, extrusion, blow molding etc.). A required heavy loading of metal filler severely restricts ability to manipulate processing properties in this way. A further problem is that metal fillers can be abrasive to processing machinery and may require specialized screws, barrels, and the like. Finally, despite being electrically conductive, a simple metal-filled polymer still offers no mechanism to produce adhesion of an electrodeposit since the metal particles are generally encapsulated by the resin binder, often resulting in a non-conductive resin-rich "skin". For the above reasons, fine metal particle containing plastics have not been widely used as substrates for directly electroplateable articles. Rather, they have found applications in production of conductive adhesives, pastes, and paints.

The least expensive (and least conductive) of the readily available conductive fillers for plastics are carbon blacks. Attempts have been made to produce electrically conductive polymers based on carbon black loading intended to be subsequently electroplated. Examples of this approach are the teachings of U.S. Pat. Nos. 4,038,042, 3,865,699, and 4,278, 510 to Adelman, Luch, and Chien et al. respectively.

Adelman taught incorporation of conductive carbon black into a polymeric matrix to achieve electrical conductivity required for electroplating. The substrate was pre-etched in chromic/sulfuric acid to achieve adhesion of the subsequently electroplated metal. A fundamental problem remaining unresolved by the Adelman teaching is the relatively high resistivity of carbon loaded polymers. The lowest "microscopic resistivity" generally achievable with carbon black loaded polymers is about 1 ohm-cm. This is about five orders of magnitude higher than typical electrodeposited metals such as copper or nickel. Thus, the electrodeposit bridging and coverage rate problems described above remained unresolved by the Adelman teachings.

Luch in U.S. Pat. No. 3,865,699 and Chien et al. in U.S. Pat. No. 4,278,510 also chose carbon black as an electrically conductive filler for polymeric compounds to be electroplated. However, these inventors further taught incorporation of an electrodeposit coverage or deposition rate accelerator to overcome the galvanic bridging and lateral electrodeposit growth rate problems described above. In the embodiments, examples and teachings of U.S. Pat. Nos. 3,865,699 and 4,278,510, it was shown that certain sulfur bearing materials, including elemental sulfur, can function as electrodeposit coverage or growth rate accelerators to overcome those problems associated with electrically conductive polymeric substrates having relatively high resistivity. In addition to elemental sulfur, sulfur in the form of sulfur donors such as sulfur chloride, 2-mercapto-benzothiazole, N-cyclohexyle-2-benzothiaozole sulfonomide, dibutyl xanthogen disulfide, and tetramethyl thiuram disulfide or combinations of these and sulfur were identified. Those skilled in the art will recognize that these sulfur donors are the materials which have been used or have been proposed for use as vulcanizing agents or accelerators. Since the polymer-based compositions taught by Luch and Chien et al. could be electroplated directly they could be accurately defined as directly electroplateable resins (DER). These resins can be generally described as electrically conductive polymers with the inclusion of a growth rate accelerator.

Specifically for the present invention, directly electroplateable resins, (DER), are characterized by the following features:
(a) having a polymer or resin matrix or binder;
(b) presence of conductive fillers in the polymer matrix in amounts sufficient to provide an electrical volume resistivity of the polymer/conductive filler mix which is sufficiently low to allow direct electrodeposition. Typically, a resistivity less than 1000 ohm-cm., e.g., 100 ohm-cm., 10 ohm-cm., 1 ohm-cm. 0.1 ohm-cm., 0.01 ohm-cm., 0.001 ohm-cm., suffices;
(c) presence of an electrodeposit coverage rate accelerator;
(d) presence of the polymer, conductive filler and electrodeposit coverage rate accelerator in the directly electroplateable composition in cooperative amounts required to achieve direct coverage of the composition with an electrodeposited metal or metal-based alloy. It has been found that Group VIII metals or Group VIII metal-based alloys are particularly suitable as the initial electrodeposit on the DER surface.

It is understood the electrical conductivity required to allow for direct electrodeposition can also be achieved thru the use of an inherently conductive polymer. In this instance it may not be necessary to add conductive fillers to the polymer.

In his patents, Luch specifically identified elastomers such as natural rubber, polychloroprene, butyl rubber, chlorinated butyl rubber, polybutadiene rubber, acrylonitrile-butadiene rubber, styrene-butadiene rubber etc. as suitable for the matrix polymer of a directly electroplateable resin. Other polymers identified by Luch as useful included polyvinyls, polyolefins, polystyrenes, polyamides, polyesters and polyurethanes.

When used alone, the minimum workable level of carbon black required to achieve "microscopic" electrical resistivities of less than 1000 ohm-cm. for a polymer/carbon black mix appears to be about 8 weight percent based on the combined weight of polymer plus carbon black. The "microscopic" material resistivity generally is not reduced below about 1 ohm-cm. by using conductive carbon black alone. This is several orders of magnitude larger than typical metal resistivities. Other well known, finely divided highly conductive fillers (such as metal flake) can be considered in DER applications requiring lower "microscopic" resistivity. In these cases the more highly conductive fillers can be used to augment or even replace the conductive carbon black.

The "bulk, macroscopic" resistivity of conductive carbon black filled polymers can be further reduced by augmenting the carbon black filler with additional highly conductive, high aspect ratio fillers such as metal containing fibers. This can be an important consideration in the success of certain applications. Furthermore, one should realize that incorporation of non-conductive fillers may increase the "bulk, macroscopic" resistivity of conductive polymers loaded with finely divided conductive fillers without significantly altering the "microscopic resistivity" of the conductive polymer.

It is important to recognize a number of important characteristics of directly electroplateable resins (DERs) which facilitate the current invention. First, regarding electrodeposit coverage rate accelerators, both Luch and Chien et al. in the above discussed U.S. patents demonstrated that sulfur and other sulfur bearing materials such as sulfur donors and accelerators served this purpose when using an initial Group VIII "strike" layer. One might expect that other elements of Group 6A nonmetals, such as oxygen, selenium and tellurium, could function in a way similar to sulfur. In addition, other combinations of electrodeposited metals and nonmetal coverage rate accelerators may be identified. It is important to recognize that such an electrodeposit coverage rate accelerator is extremely important in order to achieve direct electrodeposition in a practical way onto polymeric substrates having relatively high resistivity compared to metals (i.e. 0.001 ohm-cm. or above) or very thin electrically conductive polymeric substrates having restricted current carrying ability.

A second important characteristic of directly electroplateable resins is that electrodeposit coverage speed depends not only on the presence of an electrodeposit coverage rate accelerator but also on the "microscopic resistivity" and less so on the "macroscopic resistivity" of the DER formulation. Thus, large additional loadings of functional non-conductive fillers can be tolerated in DER formulations without undue sacrifice in electrodeposit coverage or adhesion. These additional non-conductive loadings do not greatly affect the "microscopic resistivity" associated with the polymer/conductive filler/electrodeposit coverage rate accelerator "matrix" since the non-conductive filler is essentially encapsulated by "matrix" material. Conventional "electroless" plating technology does not permit broad compositional flexibility.

A third important characteristic of DER technology is its ability to employ polymer resins generally chosen in recognition of the fabrication process envisioned and the intended end use requirements. For example, should an extrusion blow molding fabrication be desired, resins having the required high melt strength can be employed. Should the part be injection molded and have thin wall cross-sections, a typical situation encountered in EMI shielding, a high flow resin can be chosen. Should a coating, ink, paint, or paste be envisioned, a soluble resin such as an elastomer can be considered. All polymer fabrication processes require specific resin processing characteristics for success. The ability to "custom formulate" DER's to comply with these changing processing and end use requirements while still allowing facile, quality electroplating is a significant factor in the selective electroplating teachings of the current invention. Conventional "electroless" plating technology does not permit great flexibility to "custom formulate".

Due to multiple performance problems associated with their intended end use, none of the attempts identified above to produce a directly electroplateable plastic has ever achieved any recognizable commercial success. Nevertheless, the current inventor has persisted in personal efforts to overcome certain performance deficiencies associated with the initial DER technology. Along with these efforts has come a recognition of unique and eminently suitable applications employing the DER technology especially for those applications requiring electromagnetic shielding.

In order to eliminate ambiguity in terminology, for the present invention the following definitions are supplied:

"Metal-based" refers to a material or structure having at least one metallic property and comprising one or more components at least one of which is a metal or metal-containing alloy.

"Alloy" refers to a substance composed of two or more intimately mixed materials.

"Group VIII metal-based" refers to a substance containing by weight 50% to 100% metal from Group VIII of the Periodic Table of Elements.

OBJECTS OF THE INVENTION

An object of the invention is to produce unique and novel structures for achieving exceptional shielding of electromagnetic radiation.

A further object of the invention is to teach improved and simplified processes for producing electromagnetic interference (EMI) shields.

A further object of the invention is to provide low cost materials and composites capable of being fabricated into EMI shields using multiple different processes.

These and other objects of the invention will become clear in light of the accompanying figures and description of the preferred embodiments.

SUMMARY OF THE INVENTION

This current invention contemplates employing the uniquely advantageous characteristics of directly electroplateable resins to provide exceptional electromagnetic interference (EMI) shielding articles.

DESCRIPTION OF PREFERRED EMBODIMENTS

Figure 1:
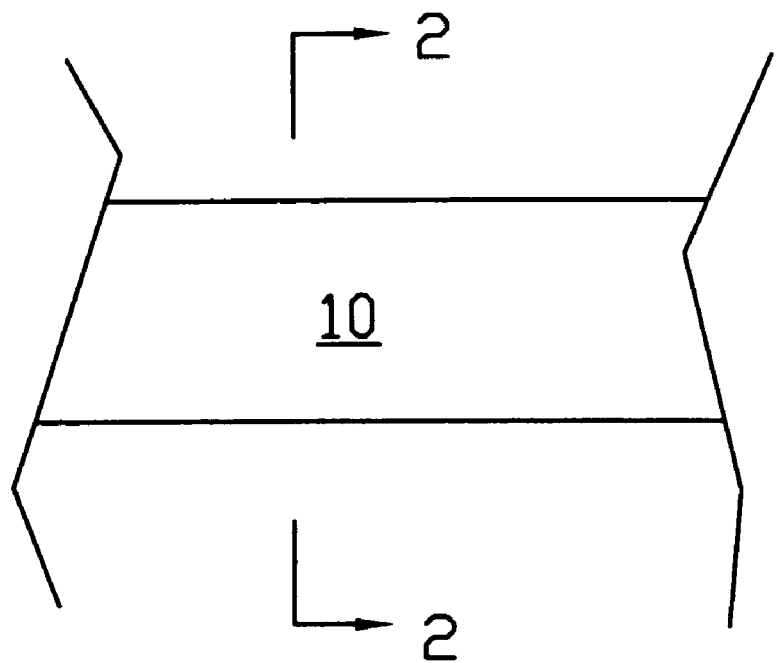
FIG. 1 is a top plan view of an electromagnetic radiation shield according to one embodiment of the invention.
Figure 2:
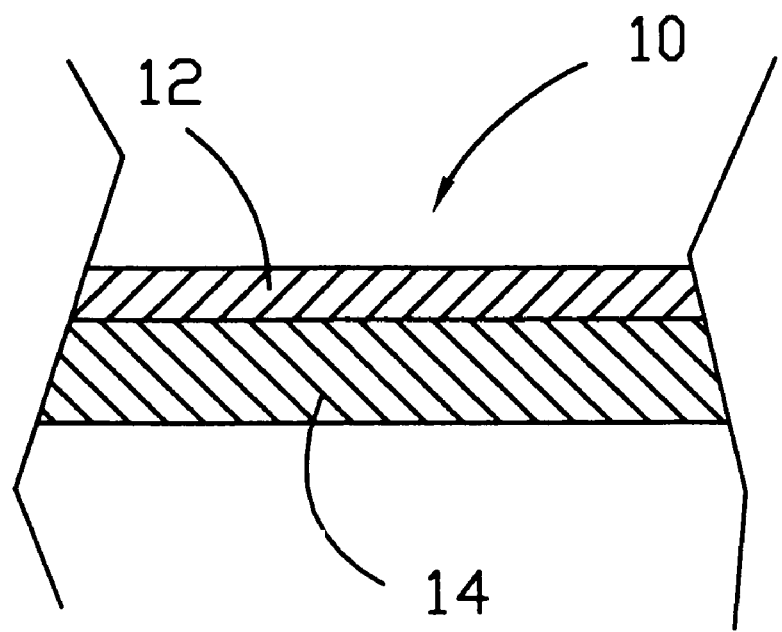
FIG. 2 is a sectional view taken substantially along the line 2—2 of FIG. 1.

Referring to FIG. 1, there is shown a top plan view of an embodiment of an electromagnetic interference (EMI) radiation shield of the present invention. FIG. 2, a sectional view of this embodiment of FIG. 1, shows a structure comprising a directly electroplateable resin (DER) 14 coated on one side with a metal-based layer 12 comprising an electrodeposit in contact with the DER. While shown as a single layer, it is understood that the metal-based layer 12 can comprise multiple layers of various materials intended to achieve desired functional or aesthetic results. Similarly, while shown as a single layer, the DER portion of the structure can comprise multiple layers. In addition, the inventor has established through his experiments that the plateablity characteristics of DER (lateral coverage speed with electrodeposit and electrodeposit adhesion) depend primarily on "microscopic resistivity" rather than "bulk, macroscopic resistivity". This allows incorporation of many additives into the DER formulation which, while they may increase "bulk, macroscopic resistivity" do not negatively impact plateability to any significant degree. Such additives can be incorporated to produce, for example, physical property and dimensional stability enhancements, flame retardant ability, magnetic properties, and shielding enhancements. This characteristic of DER formulations is a unique advantage in design of shielding articles.

As will be shown, the basic structure depicted in FIGS. 1 and 2 results in exceptional EMI shielding performance.

Figure 3:
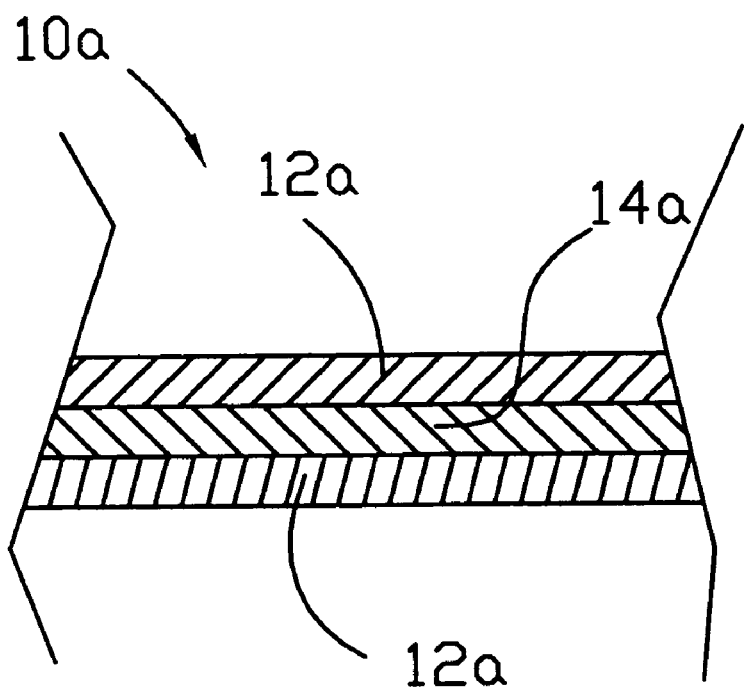
FIG. 3 is a sectional view similar to FIG. 2 of an alternate embodiment of a shield structure according to the invention.

In the embodiment of FIG. 2, the laminate comprises a metal-based layer 12 on a single side of the DER substrate 14. FIG. 3 shows an embodiment 10a having metal 12a deposited on both sides of the DER substrate 14a. As will be shown, the dual metal layers augment the shielding relative to a single-sided metal-based deposit.

Figure 4:
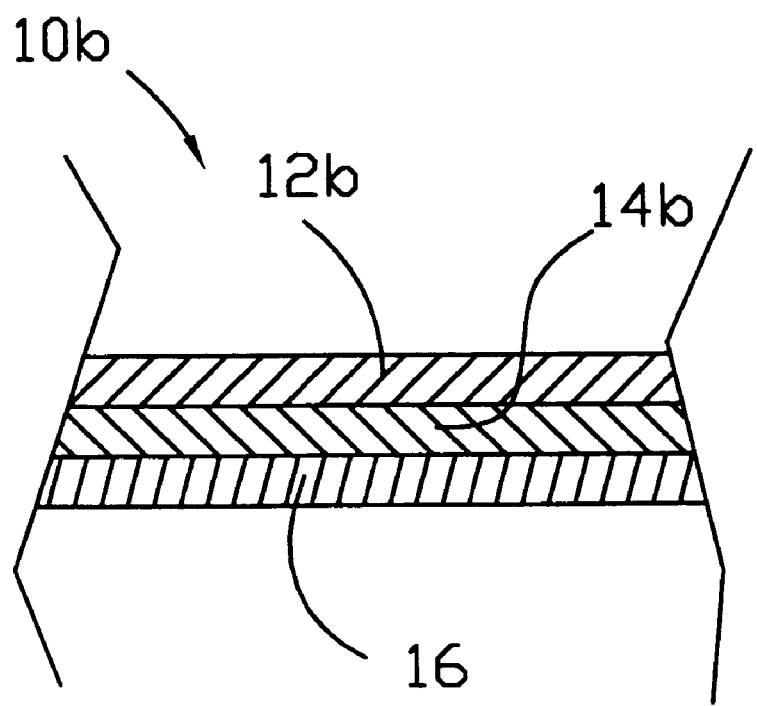
FIG. 4 is a sectional view similar to FIGS. 2 and 3 of yet another embodiment of the invention.

FIG. 4 shows an additional embodiment 10b wherein a laminate of a metal-based layer 12b is deposited on a DER layer 14b, which in turn is deposited on an additional support layer 16. This structure may be chosen to utilize certain processing or mechanical properties of the support which could be difficult to achieve with the single layer DER formulation alone. The additional support could, for example, be chosen as a conductive fiber-containing resin to further augment the shielding imparted by the DER/metal composite. Alternatively, the support could be a material chosen to augment the physical properties of the shielding laminate or to allow fabrication alternatives which could be difficult to achieve with a DER formulation alone. The laminate of FIG. 4 illustrates another important advantage of DER shielding laminates. In many cases one would want to minimize the use of DER in such composites for cost, processing, structural or other reasons. The DER allows one to produce relatively thin sections through very high injection rates in an injection molding operation where the plateable DER layer is molded over a substrate. Thin walled DER sections approximately 0.020 inch have been produced as laminated layers on supporting substrates in either "overmolding" or "two color" molding operations. Since the electrodeposit bonding to DERs is chemical in nature and far less sensitive to surface morphology than conventional plating on plastics technologies, the ultra rapid injection rates required for thin-walled molding is possible using DERs.

DER thicknesses far less than 0.020 inch are also possible with DER's using techniques such as film extrusion and liquid paint coatings. The relative "transparency" of DER performance to fabrication parameters and surface morphology is a considerable contribution to the EMI shielding art. Indeed, DER formulations can be fabricated using virtually any thermoplastic fabrication process, including injection or compression molding, extrusion, blow molding, thermoforming and solution coating.

Figure 5:
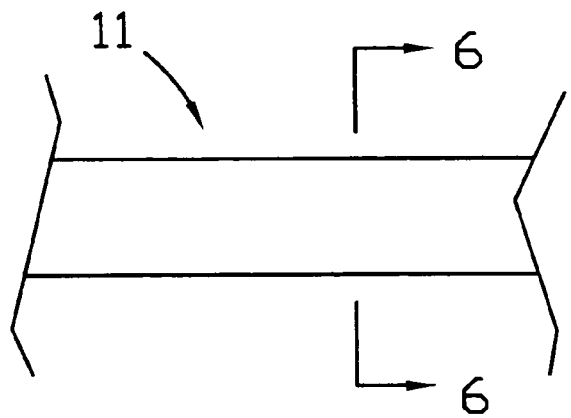
FIG. 5 is a plan view of a shielding gasket according to the teachings of the current invention.
Figure 6:
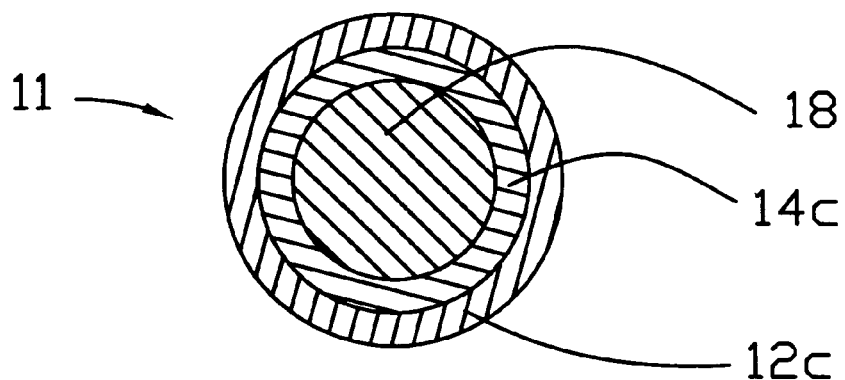
FIG. 6 is a sectional view taken substantially along line 6—6 of FIG. 5.

FIGS. 5 and 6 illustrate yet another embodiment 11 of the current invention. In FIGS. 5 and 6, numeral 11 identifies an elongate article whose structure is best shown in cross sectional detail in FIG. 6. In FIG. 6, central core 18 is formed of a resilient material such as a solid elastomer or foam. DER layer 14c covers the core 18, while metal-based layer 12c is deposited on the outside surface of DER layer 14c. Metal-based layer 12c can comprise an electrodeposit or, as will be shown, a fibrous mesh comprising an electroplated DER. The article 11 represents an effective EMI shielding gasket.

Figure 7:
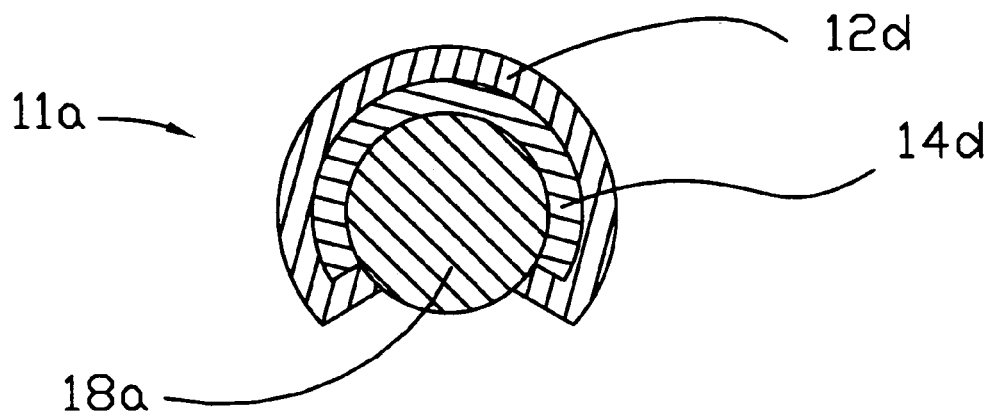
FIG. 7 is a view similar to FIG. 6 of an alternate form of shielding gasket according to the invention.

In some instances, EMI gasket 11, as depicted in FIGS. 5 and 6, may not show sufficient compression and resiliency due to the circular cross section shown and the rigidity of the electrodeposited outer sheath 12c. However, because the DER material is readily extrudable in a continuous fashion, alternative, more pliable cross sectional structures for the EMI gasket can be advanced. For example, FIG. 7 illustrates a cross sectional structure of an EMI gasket wherein the DER material extends around only a portion of the central core 18a. The subsequent metal-based electrodeposit 12d coats only that portion of the exterior where the DER 14d is positioned as shown since the remaining exposed surface of core 18a is non-conductive. Thus a selectively metallized gasket having improved compression characteristics and resiliency is produced.

Figure 8:
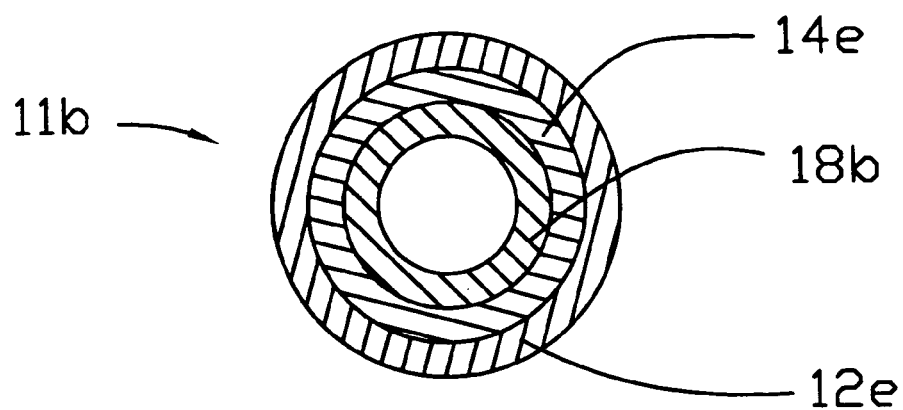
FIG. 8 is a sectional view similar to FIG. 6 of an alternate structural embodiment.

FIG. 8 illustrates an alternative means of achieving increased compressibility for gaskets of the current invention. In FIG. 8, central core 18b is formed as a hollow tube-like structure coated with a first DER layer 14e and a subsequent metal-based electrodeposit 12e.

Figure 9:
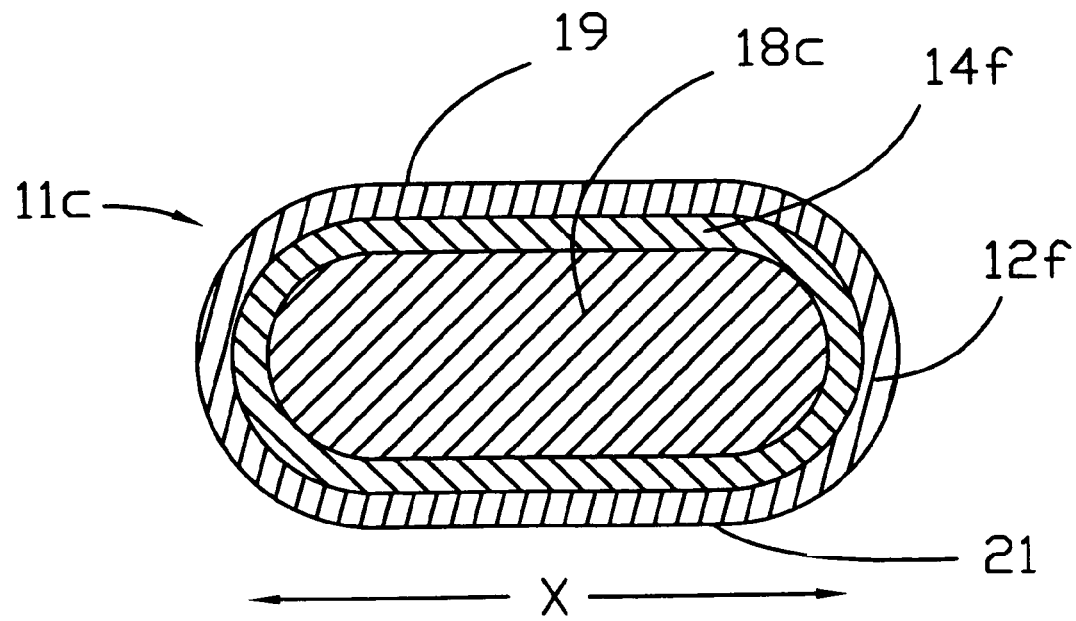
FIG. 9 is a sectional view similar to FIG. 6 of yet another alternate structural embodiment.

FIG. 9 shows a sectional view of yet another gasket structure employing DER. In the FIG. 9 embodiment the article is elongated in the direction indicated by "X". Core 18c, DER layer 14f, and metal-based layer 12f in the FIG. 9 structure produces a broader surface area of ohmic contact at surfaces 19 and 21.

Figure 10:
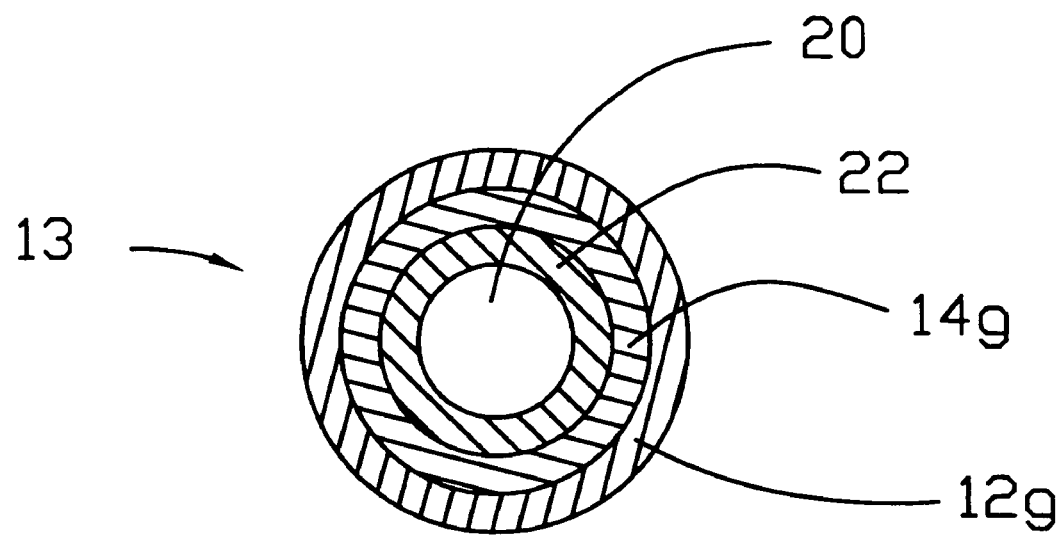
FIG. 10 is a sectional view of a coaxial cable produced according to the invention.

FIG. 10 is yet another embodiment illustrating the unique performance of DERs in contributing to shielded articles. FIG. 10 is a sectional view of a structure extending perpendicular to the plane of the paper. The article, designated as 13, has an electrically conductive core component 20 such as a metal wire. Core component 20 is surrounded by electrically insulating layer 22. A sheath of DER 14g surrounds insulating layer 22. Finally, a metal-based electrodeposit 12g is applied to the DER outer surface. The article depicted is thus a coaxial cable which can be manufactured in continuous fashion employing inexpensive materials and processing techniques.

Figure 11:
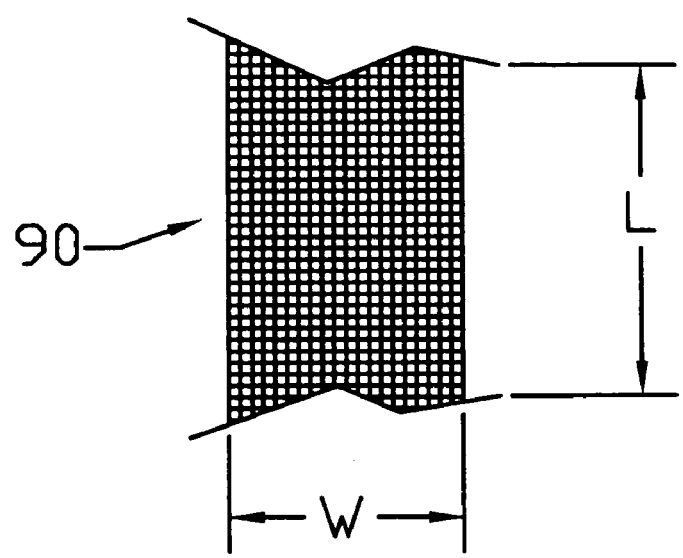
FIG. 11 is a top plan view of a starting material for another embodiment of the invention.

Referring now to FIG. 11, the starting material for yet another embodiment is illustrated in plan view. Web, mesh or fabric strip 90 is characterized by having a width "W" and a length "L". It is contemplated that length "L" can be considerably greater than width "W" and thus length "L" can generally be described as "continuous" or being able to be processed in roll-to-roll fashion.

Figure 12:
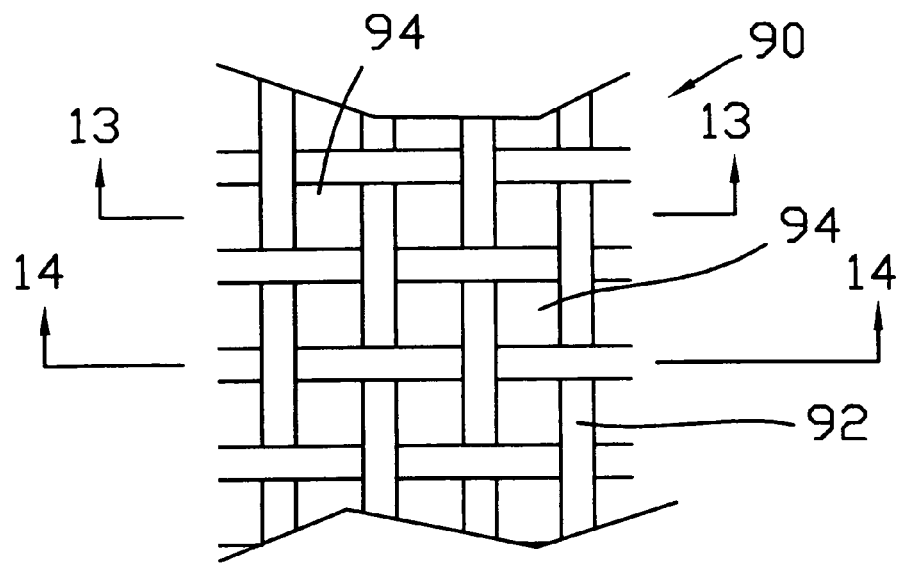
FIG. 12 is a greatly magnified plan view of the material of FIG. 11.

FIG. 12, a greatly magnified plan view of a portion of the structure of FIG. 11, shows the fabric 90 comprising fibrils 92 interwoven to form a sturdy structure. Holes 94 are present among the interwoven fibrils. It is understood that the fibrils need not be actually interwoven as shown. Equivalent structures comprising fibrils and holes, such as nonwoven, braided or knitted fabric or adhesively bonded fibril mats such as glass fiber mats, can be employed.

Figure 13:
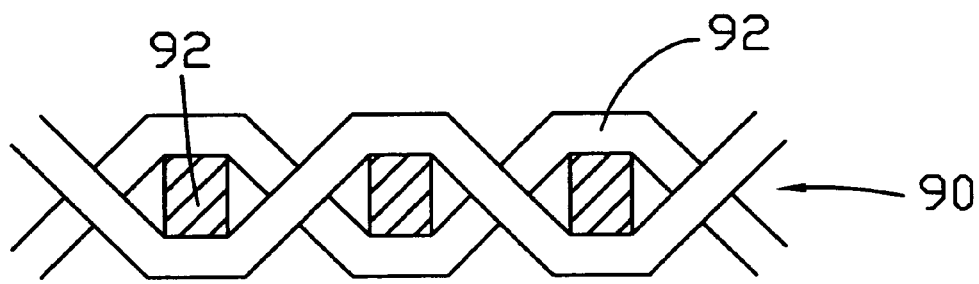
FIG. 13 is a sectional view taken substantially along line 13—13 of FIG. 12.
Figure 14:
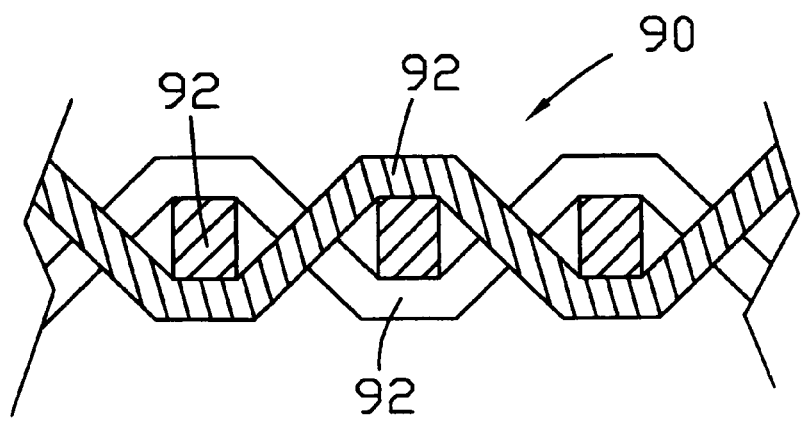
FIG. 14 is a sectional view taken substantially along line 14—14 of FIG. 12.

FIGS. 13 and 14 are sectional views of the embodiment of FIG. 12 taken substantially along lines 13—13 and 14—14 of FIG. 12 respectively. Numerals 92 indicate the fibrils in FIGS. 13 and 14.

Figure 15:
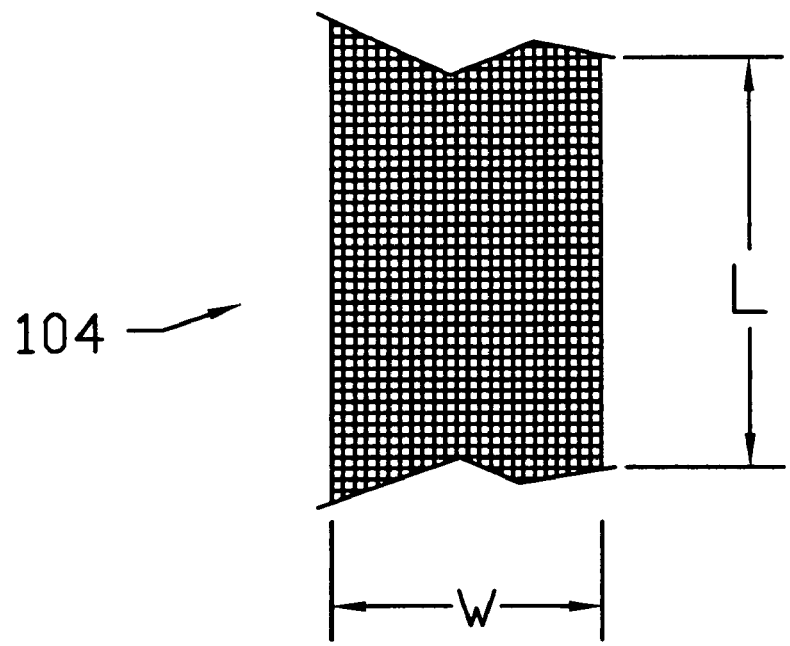
FIG. 15 is a view similar to FIG. 11 of the produced by an additional process step.

Referring now to FIG. 15, there is shown the material shown in FIGS. 11–14 following and additional processing step. The material of width "W" and length "L" is now generally designated as 104 to indicate this additional process step.

Figure 16:
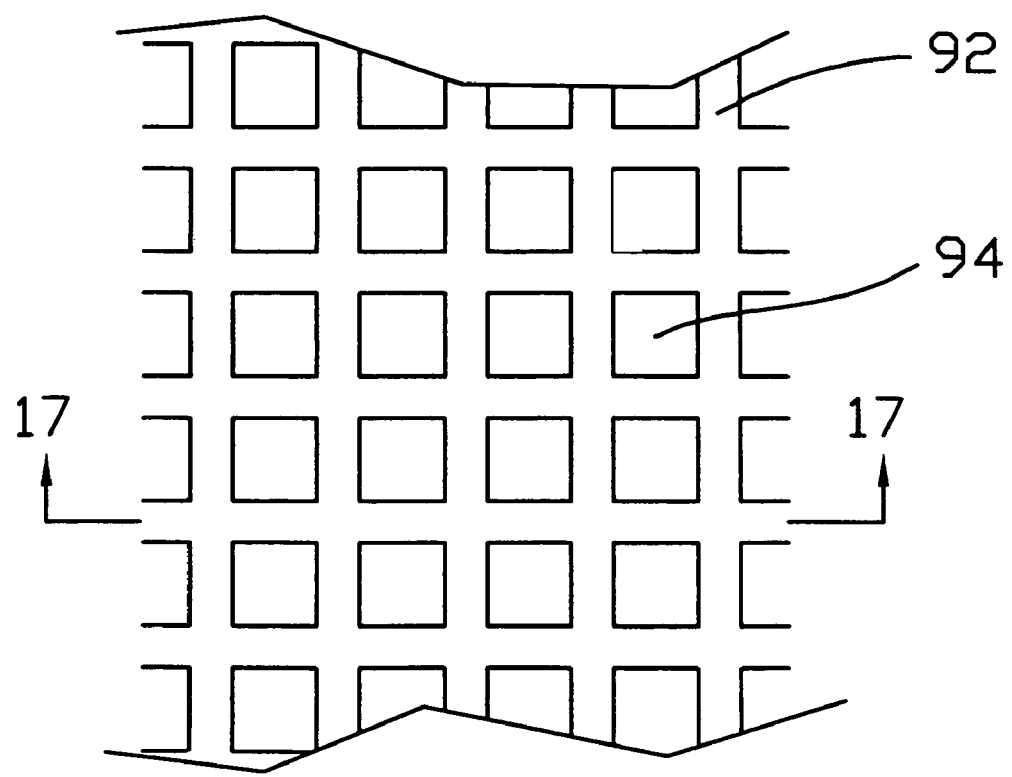
FIG. 16 is a greatly magnified plan view of a portion of FIG. 15.
Figure 17:
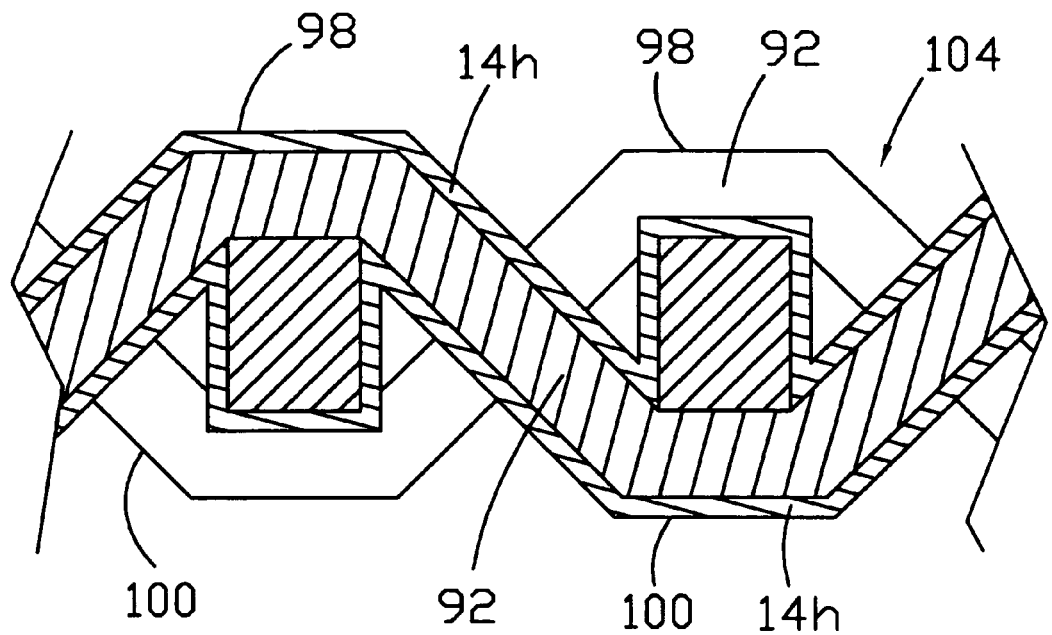
FIG. 17 is a greatly magnified sectional view of a portion of the structure of FIG. 16 taken substantially from the perspective of line 17—17 of FIG. 16.

FIG. 16 is a greatly magnified plan view of a portion of the FIG. 15 structure. In contrast to the plan view shown in FIG. 12, the structure of FIG. 16 appears continuous in the two-dimensional plan view. This continuity results from coating the fibrils 92 with an electrically conductive coating. The structure of the coated fibrils is best shown in the sectional view of FIG. 17 which is a view taken substantially along line 17—17 of FIG. 16. In FIG. 17, fibrils 92 have been coated with electrically conductive coating 14$h$. It is anticipated that coating 14$h$ and the deposition process for applying coating 14$h$ can be chosen from any number of suitable techniques. Included in such techniques are painting, dipping, or printing of conductive inks, laminating, and chemical or vapor deposition of metals or other conductive materials. In the case of a temperature resistant fabric such as fiberglass, deposition of a low melting point metal such as solder could be employed. A particularly advantageous coating 14$h$ to prepare the structure of FIG. 17 comprises DER applied using a paint solution or paste. The DER is inexpensive, and readily formulated and applied from solution form. As will be shown, the ability to formulate DER coatings using many different resin bases can be a particular advantage in shielding processes employing the embodiment of FIG. 17.

Figure 18:
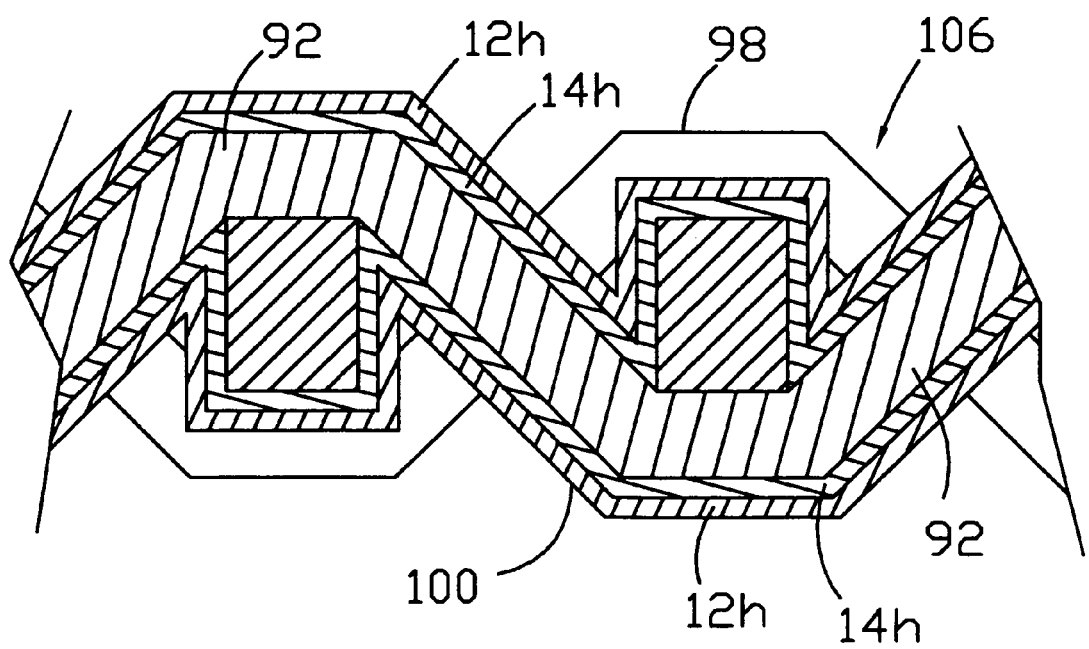
FIG. 18 is a sectional view similar to FIG. 17 showing the structure following an additional process step.

FIG. 18 is a sectional view similar to FIG. 17 following an additional optional process step. In FIG. 18, the electrical conductivity and mechanical and environmental integrity of the structure is further enhanced by applying an additional highly conductive coating 12$h$ overlaying coating 14$h$. This subsequent coating 12$h$ can be conveniently applied by electrodeposition of a metal-based material. Thus, metal-based material 12$h$ can comprise virtually any electroplateable metal, including many that melt at relatively low temperatures. The structure of FIG. 18 gives highly conductive communication among the fibers due to the continuity of the metal-based material at the cross-over points of the fibers. This structure is thus similar to a "sintering" of the fibrous mat at the cross-over points of the fibers. In addition, highly conductive communication exists from top surface 98 to bottom surface 100 by virtue of the through-hole deposition of the metal-based material.

Figure 19:
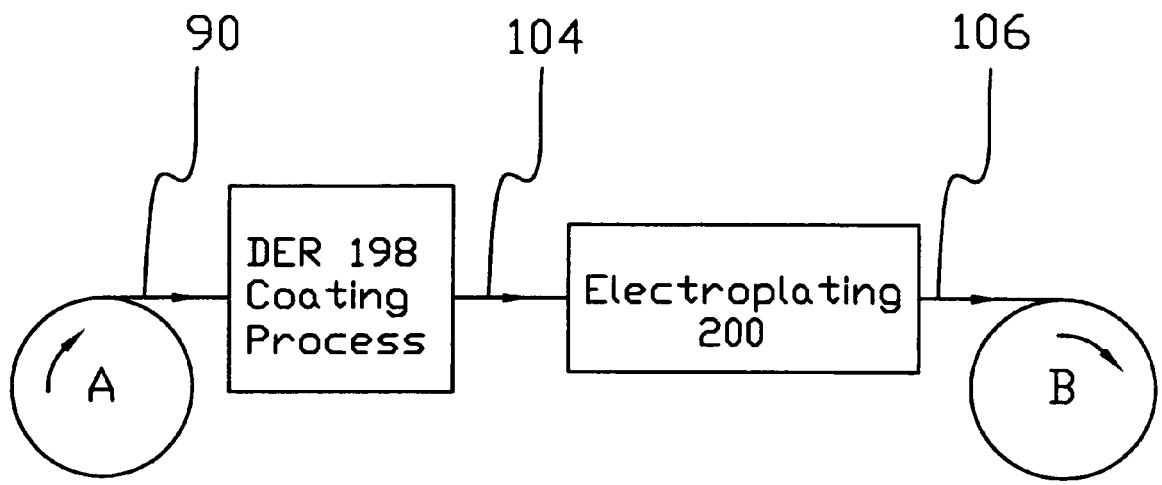
FIG. 19 is a representation of the process steps used to produce the structure depicted in FIG. 18.

FIG. 19 is a schematic representation of one process to produce the structure depicted in FIGS. 17 and 18. In FIG. 19, a roll "A" of fabric is fed to a coating process 198. The output of the coating process 198 is a coated web 104 as shown in FIG. 15. The structure 104 is then fed to an elecrodeposition process 200 which deposits a layer of metal-based material onto the web. Following this simple and straightforward electrodeposition process, the metallized web 106 is gathered onto roll "B". The metallized fibrous mat thus produced can be chopped for use as an additive to achieve bulk conductivity, significantly reducing the cost of these fibrous additives compared to the currently employed stainless steel or metallized fibers produced by other means. Alternatively, the metallized fibrous mat thus produced can be further incorporated into EMI shielding structures as embodied and taught in the following.

Figure 20:
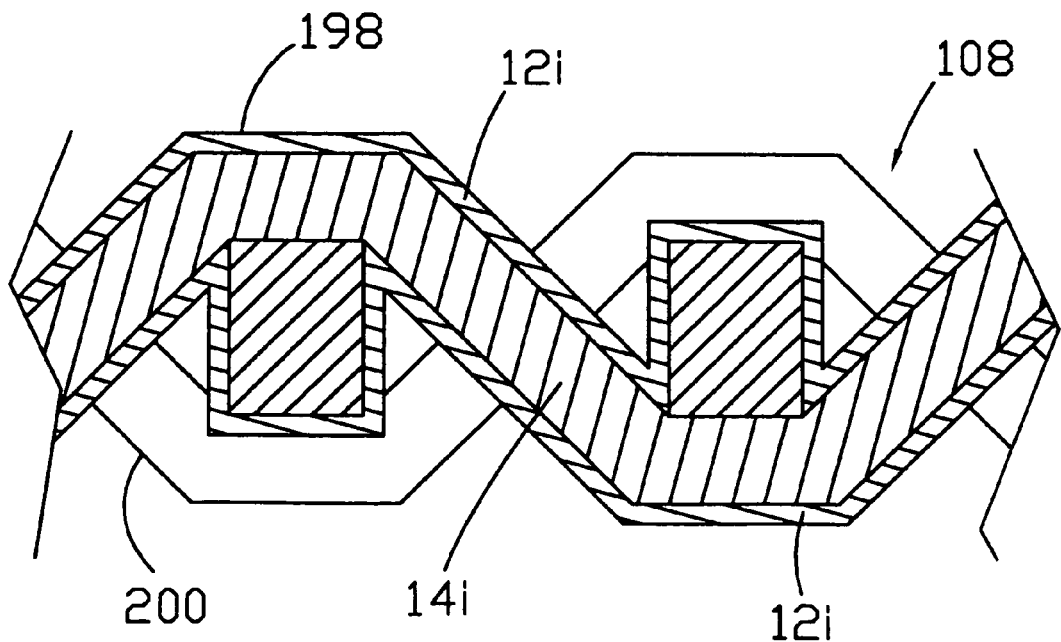
FIG. 20 is a sectional view similar to FIGS. 17 and 18 but of an alternate structure.

FIG. 20 shows another embodiment of an electroplated fabric 108. In FIG. 20, numeral 14$i$ designates a web comprising DER fibers (as contrasted to fibers coated with a DER formulation). In a fashion similar to the process of FIG. 19, the web of DER fibers are coated with a metal-based electrodeposit, designated by numeral 12$i$ of FIG. 20. In this way the process 198 of coating the fabric with DER solution coating is eliminated.

Figure 21:
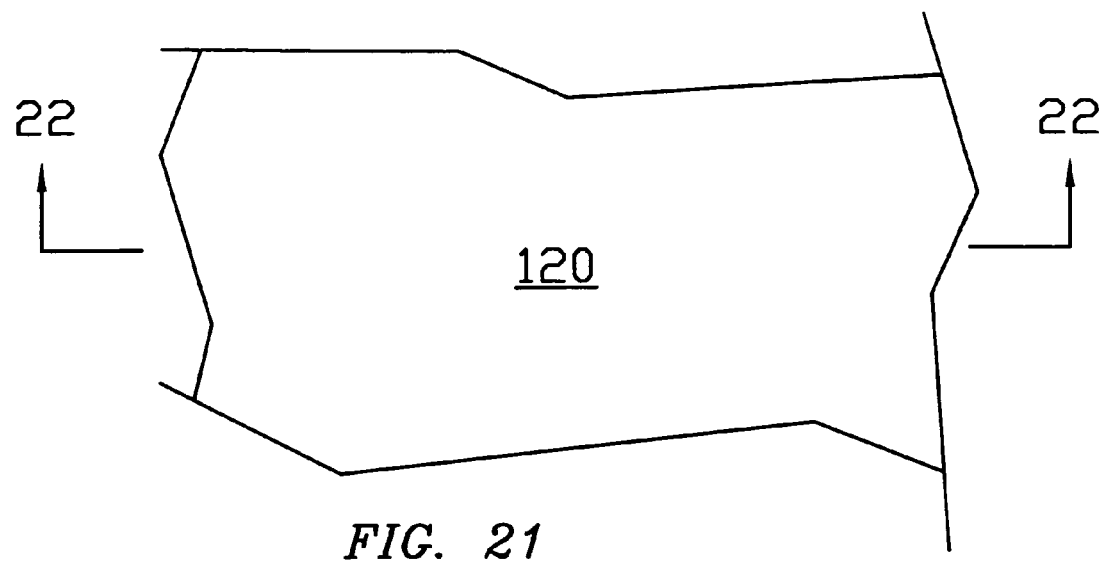
FIG. 21 is a top plan view of an additional embodiment.
Figure 22:
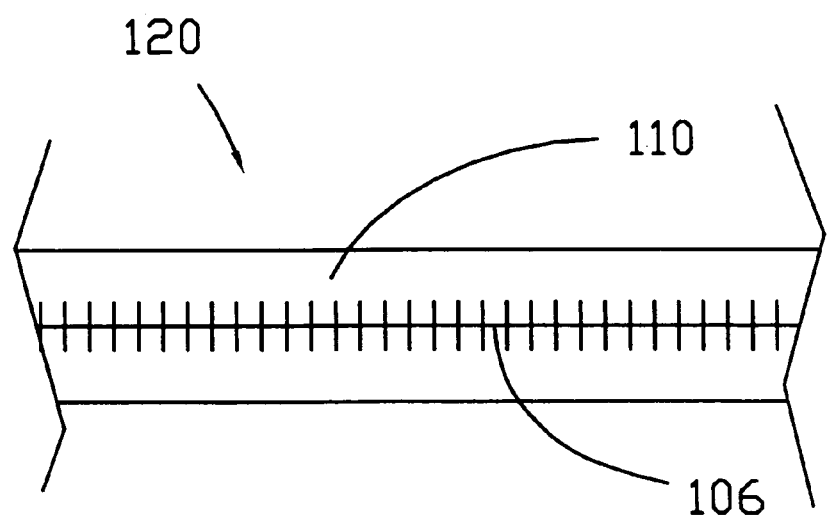
FIG. 22 is a sectional view taken substantially from the perspective of line 22—22 of FIG. 21.

FIGS. 21 and 22 show an application of the metallized webs of FIGS. 18 and 20 in a shielding structure. FIG. 21 is a top plan view of the shielding structure 120. FIG. 22, a sectional view illustrates the structure 120 comprising metallized web 106 embedded in a polymeric laminate, the polymer designated by numeral 110. It is understood that metallized web 108 of FIG. 20 could alternately be used. The laminate 120 can be employed as an EMI shield as shown in its sheetlike, planar form, or can be further fabricated into a three-dimensional form by a process such as thermoforming or stamping. With reference to the thermoforming technique, the structure depicted in FIG. 18 shows particular advantage. DER layer 14$h$ shown in FIG. 18 can be based on many different polymeric materials, including low softening point materials such as polyolefin waxes or uncured elastomers. Choosing such a low melting point material for the DER layer 14$h$ of FIG. 18 would result in the DER layer softening at temperatures below the thermoforming temperature. This would place a high level of stress on the thin electrodeposit at the cross-over points of the fibers at thermoforming temperatures. This condition allows the fibers to readily separate at the crossover points through electrodeposit fracture at these points while permitting the fibers to remain intact in their axial direction, supported by a high softening temperature fiber 92 such as glass fibers. Alternatively, one could employ an electrodeposited layer (12$h$, FIG. 18 or 12$i$, FIG. 20) comprising a metal or alloy whose melting point is below the thermoforming temperature. In this way, a very inexpensive alternative to the techniques taught by Koskenmaki et al. and Yenni, Jr. et al., referenced above, could be achieved.

Figure 23:
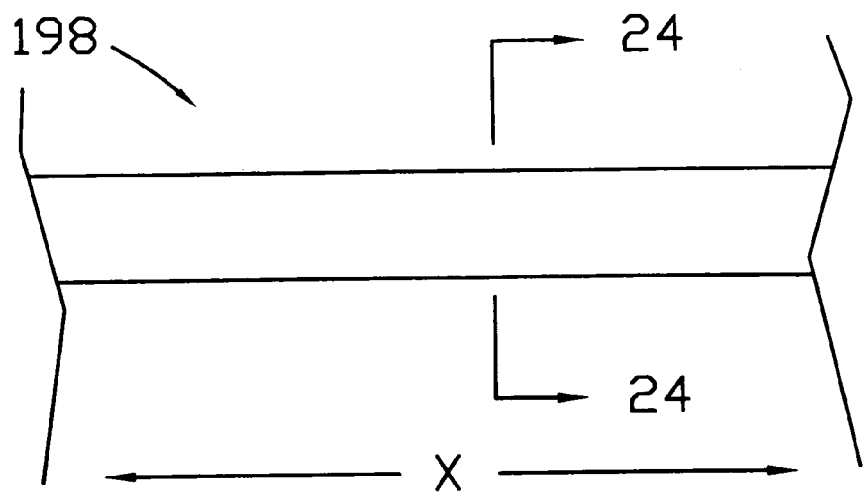
FIG. 23 is a plan view of yet another embodiment of the invention.
Figure 24:
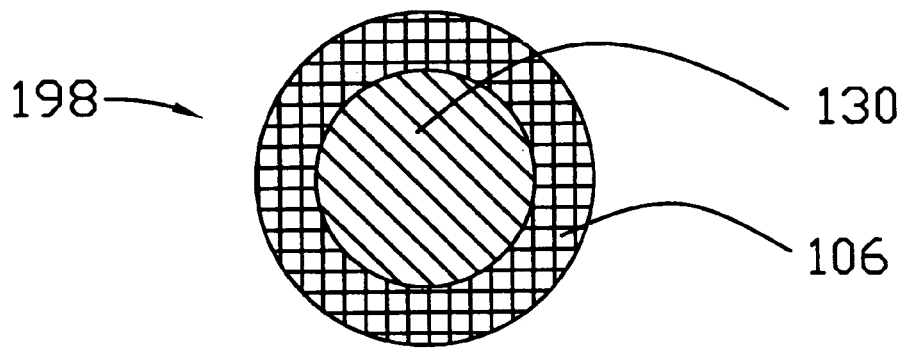
FIG. 24 is a sectional view taken substantially from the perspective of line 24—24 of FIG. 23.

FIGS. 23 and 24 illustrate another embodiments of an EMI gasket. FIG. 23 is a top plan view of a gasket 198 extending in the direction indicated by "X" in FIG. 23. FIG. 24 illustrates a sectional view of the gasket 198 showing a resilient core 130 surrounded by the metal containing mesh 106 shown in the embodiment of FIG. 18. Here, the inexpensive mesh 106 is used to replace the expensive wire meshes currently employed in high performance EMI gaskets.

Figure 25:
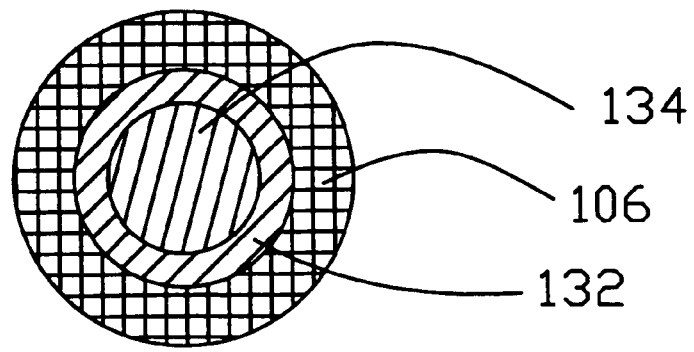
FIG. 25 is a sectional view of a coaxial cable produced according to the teachings of the invention.

FIG. 25 is an embodiment of a coaxial cable employing inner conductor 134, insulator 132 and outer conductive sheath 106 comprising the structure as taught in conjunction with FIG. 18.

It is understood that the metallized mesh 108 of FIG. 20 could be chosen as the exterior sheath for the FIG. 23 through FIG. 25 embodiments rather than mesh 106.

Example 1

The following solid ingredients were weighed out.

33.4 grams Nitrile Rubber (Nipol 1432—Zeon Chemical)
15.0 grams carbon black (Vulcan XC-72—Cabot Corp.)
0.58 grams sulfur The solid ingredients were added to a solvent mixture of 155 grams carbon tetrachloride and 155 grams xylene. This produced a fluid coating formulation which, after drying, consisted of:

Nitrile rubber—60.3%

Carbon black—30.6%

Sulfur—1.2%

A section of a standard commercial home furnace filter comprising a fiber glass mat was immersed in the coating solution, removed and allowed to dry. The coated mat was then immersed as a cathode in a standard Watts nickel plating bath. The coated mat quickly covered with nickel electrodeposit, resulting in a highly conductive metallized fabric characterized by having metal continuity at the crossover points of the fibers.

Example 2

A solid thermoplastic DER formulation was molded into a number of flat plaques having a thickness 0.095 inch. The DER composition comprised a polypropylene copolymer at 65 percent, conductive carbon black at 30 percent, zinc oxide at 2 percent, MBTS at 2 percent, and sulfur at 1 percent. The plaques were then electroplated with the electrodeposits as shown in Table I.

TABLE I

| | Plaque Sample Number | | | | |
|---|---|---|---|---|---|
| Deposit | 1 | 2 | 3 | 4 | 5 |
| Nickel Strike (inch) | 0 | .0001 | .0001 | .0001 | .0001 |
| Acid Copper (inch) | 0 | .0008 | 0 | 0 | .0008 |
| Watts Nickel Top Deposit (inch) | 0 | .0001 | 0 | .0009 | .0001 |
| Bright Nickel (inch) | 0 | .000 | .0009 | 0 | 0 |

Plaque sample 1 was unplated and served as the control to evaluate electrodeposit performance. Plaques 2–4 were plated on both opposite sides of the plaque with the indicated electrodeposit. Plaque 5 was plated on only a single side with the indicated electrodeposit.

The composite electroplated plaques were tested for EMI shielding performance. The results appear in Table II, wherein the shielding values achieved are reported in decibels (dB).

TABLE II

| | Frequency (GHz) | | | | |
|---|---|---|---|---|---|
| Plaque Sample | 1.0 | 2.5 | 5.0 | 7.5 | 10. |
| 1 | 18 | 22 | 20 | 22 | 23 |
| 2 | 82 | 79 | 84 | 59 | 50 |
| 3 | 83 | 70 | 76 | 49 | 42 |
| 4 | 84 | 59 | 47 | 45 | 53 |
| 5 | 84 | 71 | 66 | 50 | 55 |

The results show good to excellent shielding performance for the DER composites comprising copper/nickel and bright nickel electrodeposits up to 5 GHz, well in excess of frequencies anticipated in the near future. A minor augmentation of shielding performance appears to be supplied by the DER substrate itself. This suggests that even improved shielding performance can be achieved by further loading of the DER substrate with additional conductive fillers such as metal containing fibers or flake. Also, as pointed out previously, since the plateability of the DER depends more on "microscopic" resistivity rather than "macroscopic/bulk" resistivity, non-conductive fillers can be considered in the DER formulations for strength, dimensional stability, magnetic characteristics or other desired attributes. Comparison of samples 2 and 5 shows an improvement in shielding performance by plating both opposite sides of an article as compared to a single sided deposition.

Although the present invention has been described in conjunction with preferred embodiments, it is to be understood that modification, alternatives and equivalents may be included without departing from the spirit and scope of the inventions, as those skilled in the art will readily understand. Such modifications, alternatives and equivalents are considered to be within the purview and scope of the invention and following claims.

What is claimed is:

1. A shield for electromagnetic radiation comprising an electrically conductive material configured as at least a portion of said shield, said electrically conductive material comprising, An electrically conductive polymer An electrodeposit growth rate accelerator.

2. A shield according to claim 1 wherein said electrically conductive polymer comprises an electrically conductive filler.

3. A shield according to claim 1 further comprising a metal-based electrodeposit.

* * * * *